United States Patent [19]
Tanaka

[11] Patent Number: 5,973,927
[45] Date of Patent: Oct. 26, 1999

[54] MOUNTING STRUCTURE FOR AN INTEGRATED CIRCUIT

[75] Inventor: Shinji Tanaka, Tokyo, Japan

[73] Assignee: NEC Corporation, Tokyo, Japan

[21] Appl. No.: 08/885,902

[22] Filed: Jun. 30, 1997

[30] Foreign Application Priority Data

Jul. 1, 1996 [JP] Japan .................................. 8-171420

[51] Int. Cl.$^6$ .................................................. H05K 7/02
[52] U.S. Cl. .......................... 361/760; 361/792; 361/748; 361/764; 361/750; 361/751; 361/765; 361/767; 361/772; 257/701; 257/774; 257/700; 257/686; 257/782; 257/783
[58] Field of Search ...................... 361/760, 792, 361/748, 764, 749, 750, 751, 767, 772, 777, 765; 257/701, 738, 746, 760, 774, 700, 686, 782, 783

[56] References Cited

U.S. PATENT DOCUMENTS

| | | | |
|---|---|---|---|
| 4,975,761 | 12/1990 | Chu | 257/686 |
| 5,574,630 | 11/1996 | Kresge et al. | 361/792 |
| 5,637,920 | 6/1997 | Loo | 257/700 |
| 5,767,575 | 6/1998 | Lan et al. | 257/701 |

FOREIGN PATENT DOCUMENTS 2-185051  7/1990  Japan .

*Primary Examiner*—Leo P. Picard
*Assistant Examiner*—David Foster
*Attorney, Agent, or Firm*—Whitham, Curtis & Whitham

[57] ABSTRACT

A mounting structure for an integrated circuit device comprises a first substrate, a second substrate and an insulator. The first substrate contains conductive wiring electrically connected to the integrated circuit device. The first substrate is mounted on the second substrate which have a ground pattern. The insulator is provided between the conductive wiring and the ground pattern.

10 Claims, 5 Drawing Sheets

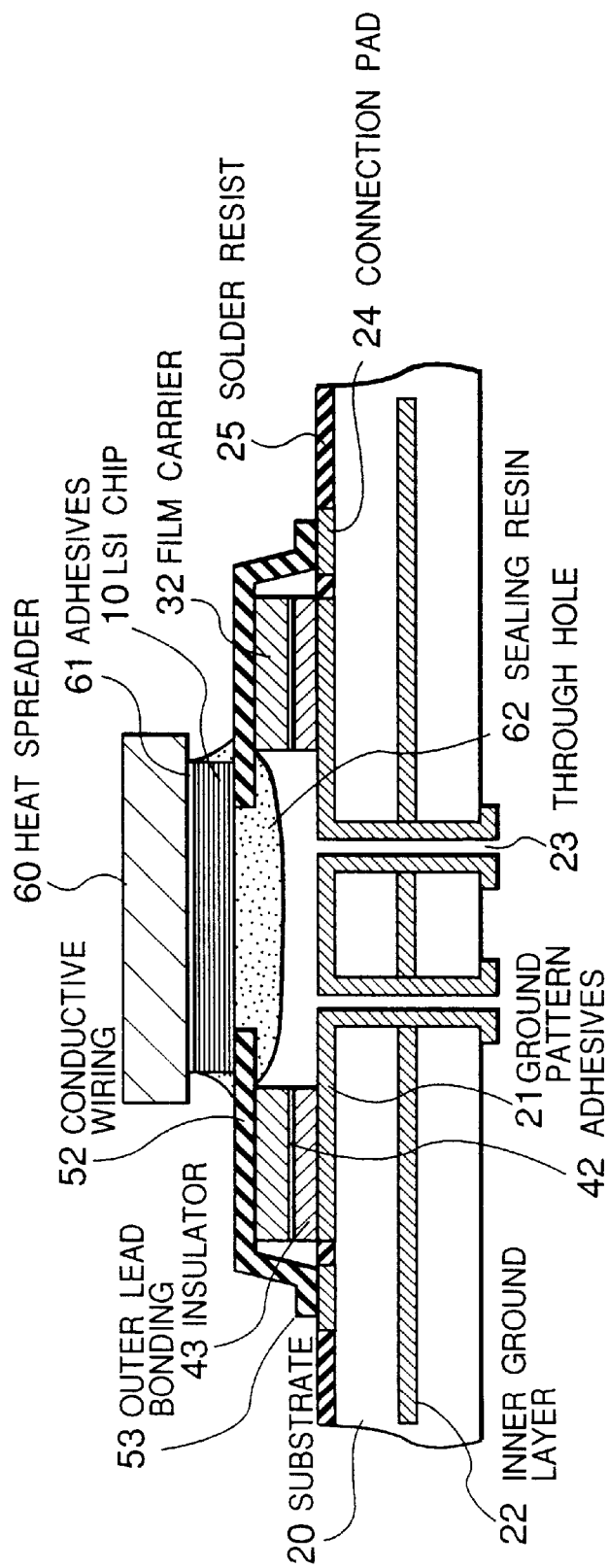

MOUNTING STRUCTURE FOR AN INTEGRATED CIRCUIT

BACKGROUND OF THE INVENTION

The present invention relates to a mounting structure for an integrated circuit device and its mounting method, and more particularly, to a mounting structure for an integrated circuit device using a film carrier and its mounting method.

An example of conventional mounting structures for integrated circuit devices is disclosed in Japanese Patent Application Laid-open No. Hei 2-185051.

Referring to FIG. 5, in the conventional mounting structure such one as disclosed in the above reference, conductive wiring 500 comprises an inner lead 501 and an outer lead 502. The inner lead 501 is connected to an electrode pad of an IC chip. The outer lead 502 is connected to a connection pad provided on the substrate. The inner and outer leads 501 and 502 are electrically connected through the conductive wiring 500 on a film carrier 300 (hereinafter referred to as Reference 1).

In addition, TAB tape having two metal wiring layers is described in Shin Kayama and Kunihiko Naruse, "Practical Lecture: VLSI Packaging Technology (Vol. 2)", 1993, Nikkei BP, p.174 (hereinafter referred to as Reference 2).

In the Reference 1, the inner and outer leads are electrically connected through first wiring on a carrier film. Noise appears in signals transmitting through the first wiring on the carrier film since the first wiring is easily affected by noise generated by signals transmitting through second wiring on the substrate. This is because only the carrier film lies between the first and second wiring without having a ground layer. In addition, there is also a problem that characteristic impedance of the second wiring on the substrate cannot be matched with impedance from the inner lead to the outer lead.

On the other hand, it is contemplated to arrange one of two metal wiring layers as a ground layer by using the TAB tape described in the Reference 2. However, the complicated manufacturing method of TAB tape leads to another problem that the lead time for manufacturing becomes longer.

SUMMARY OF THE INVENTION

In view of the aforementioned problems of the prior art, an object of the present invention is to provide a mounting structure for an integrated circuit device which improves electrical characteristics, and can operate higher speed. More specifically, it is to provide a mounting structure for an integrated circuit device that can eliminate noise generated by the wiring running in the substrate, and that can match characteristic impedance of wiring in the substrate with impedance from the outer lead to the inner lead.

Another object of the present invention is to provide a mounting structure for an integrated circuit device which improves electrical characteristics without layering the metal wiring layers of the film carrier.

According to an aspect of the present invention, there is provided a mounting structure for an integrated circuit device which comprises conductive wiring provided on a first substrate and electrically connected to said integrated circuit device mounted on said first substrate, a ground pattern provided on an area of a second substrate corresponding to said conductive wiring and an insulator provided between said conductive wiring and said ground pattern.

In another aspect, a mounting structure for an integrated circuit device comprise an insulator which both surfaces are even.

BRIEF DESCRIPTION OF THE DRAWINGS

Other features and advantages of the invention will be made more apparent from the detailed description hereunder taken in conjunction with the accompanying drawings, wherein:

FIG. 4 is a cross-sectional view of a second embodiment of the present invention.

In the drawings, the same reference numerals represent the same structural element.

DETAILED DESCRIPTION OF THE PREFERRED EMBODIMENTS

Figure 1:
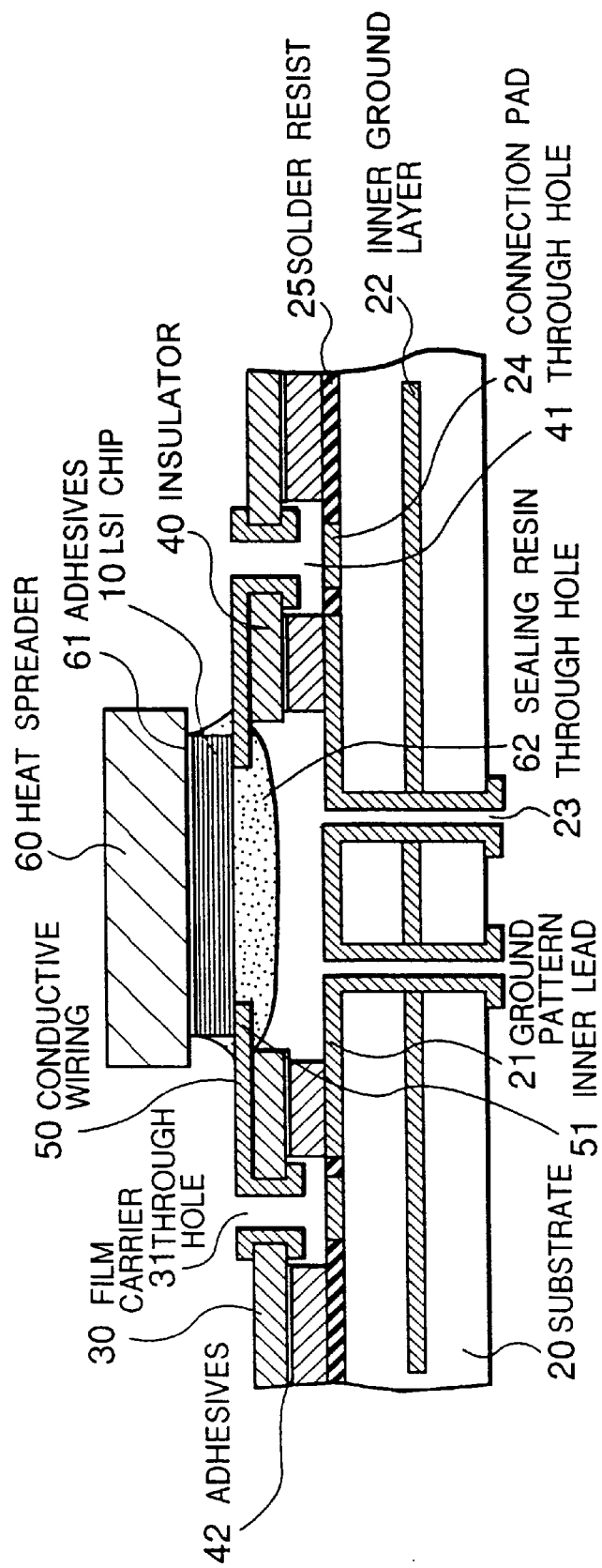
FIG. 1 is a cross-sectional view of a first embodiment of the present invention.

Now, the present invention will be explained by referring to the drawings.

Figure 2:
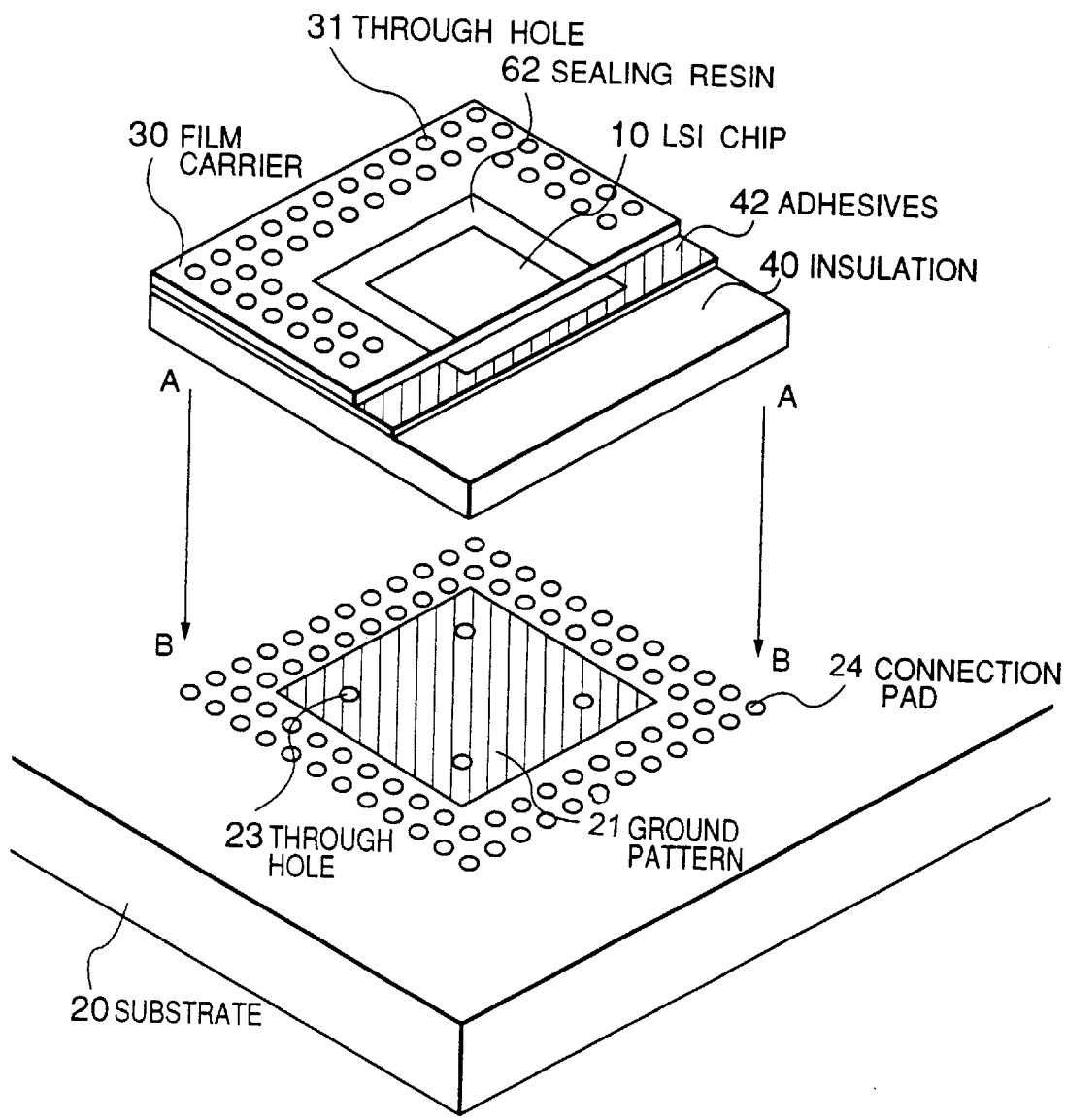
FIG. 2 is a perspective view of the first embodiment of the present invention.
Figure 3A:
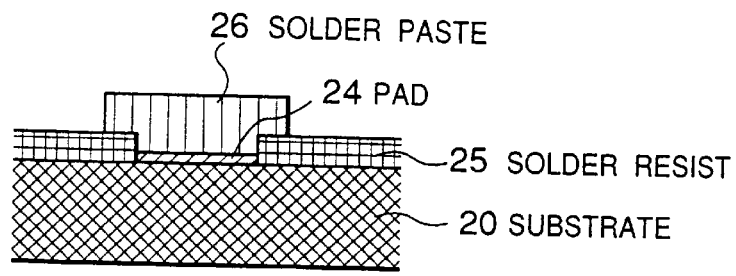
FIG. 3 is a manufacturing process of the first embodiment of the present invention.
Figure 3B:
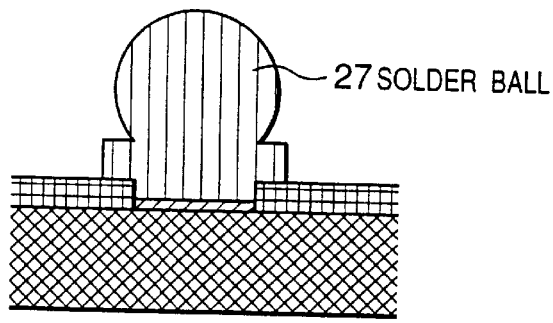
Figure 3C:
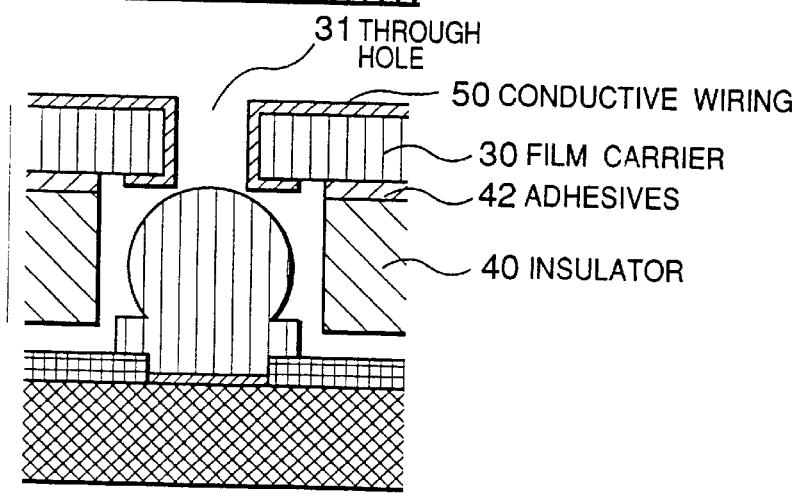
Figure 3D:
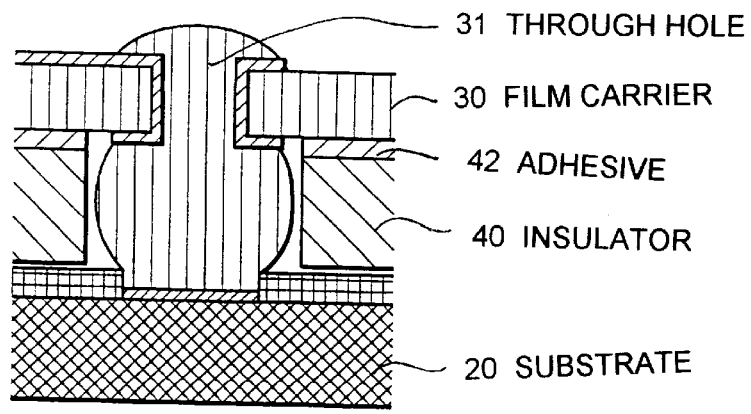
Figure 5:
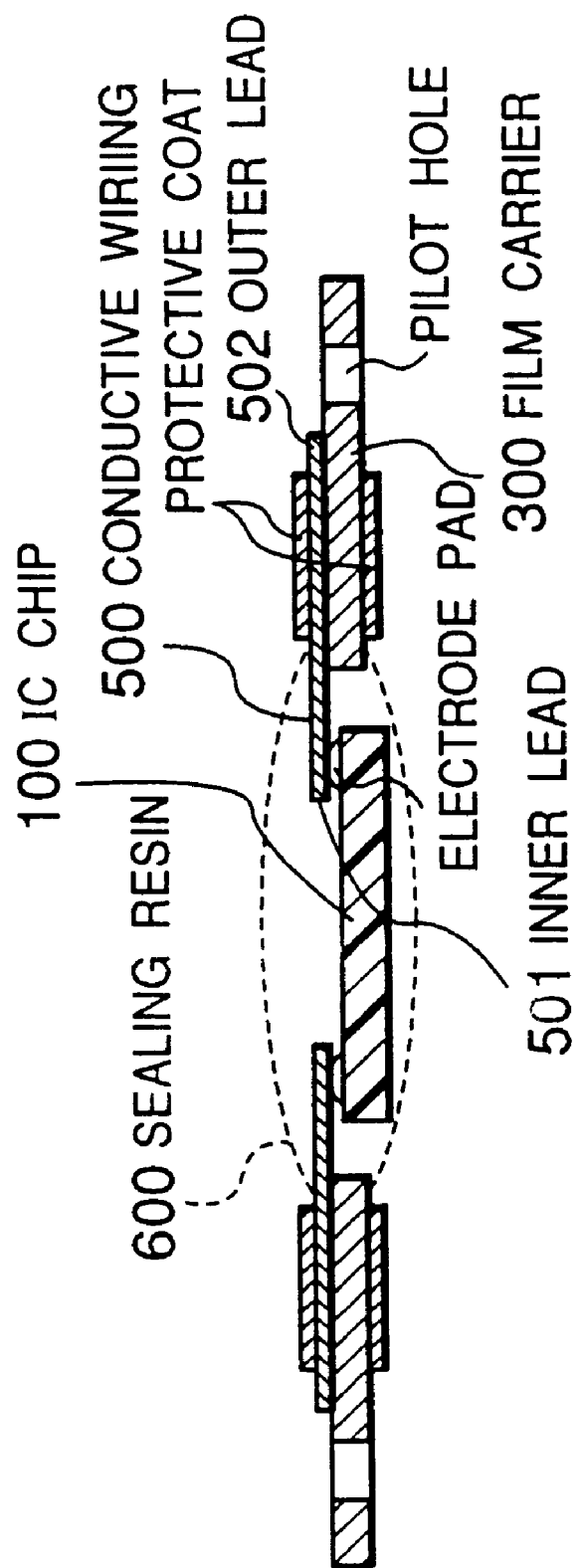
FIG. 5 is a cross-sectional view of a conventional mounting structure for an integrated circuit device.

Referring to FIGS. 1 and 2, a first embodiment of a mounting structure for an integrated circuit device according to the present invention comprises an LSI (Large Scale Integrated circuit) chip 10, a substrate 20, a film carrier 30, an insulator 40, and a ground pattern 21 provided on the substrate 20.

The LSI chip 10 is mounted on the film carrier 30 and electrically connected to a plurality of conductive wiring 50 on the film carrier 30. The film carrier 30 is provided with a plurality of through-holes 31. The plurality of through-holes 31 are connected to the plurality of conductive wiring 50 according to a wiring pattern.

A plurality of connection pads 24 are arranged on the substrate 20 at positions corresponding to the through-holes 31 provided in the film carrier 30. The connection pads 24 are electrically connected to the conductive wiring 50.

The ground pattern 21 is formed on the top surface, on which the film carrier 30 is mounted, of the substrate 20. The ground pattern 21 is provided on an area surrounded by the plurality of connection pads 24. The area is overlaid with the ground pattern 21, i.e., it corresponds to the conductive wiring 50 and the LSI chip 10. The ground pattern 21 is electrically connected to the inner ground layer 22 of the substrate 20 through the through-holes 23 provided in the substrate 20.

The insulator 40 is provided between the ground pattern 21 and the film carrier 30. The insulator 40 is formed to have even main surfaces. More preferably they are polished. This makes the distance between the conductive wiring 50 on the film carrier 30 and the ground pattern 21 on the substrate 20 substantially equal. The thickness of the insulator 40 is selectively adjusted to match the characteristic impedance of wiring in the substrate with the impedance from the outer lead to the inner lead.

The insulator 40 have a plurality of through-holes 41. The through-holes 41 are provided at positions corresponding to the through-holes 31 of the film carrier 30, respectively. Each through-hole 41 is arranged to have a diameter larger than that of the through-hole 31.

The insulator 40 and the film carrier 30 are adhered by adhesives 42 after the through-holes 41 provided through the insulator 40 are aligned the through-holes 31 provided through the film carriers 30.

The insulator 40 and film carrier 30 are mounted on the substrate 20 by aligning the through-holes 31 with the connection pads 24 on the substrate 20. The through-holes 31 are soldered to the connection pads 24, so that the conductive wiring 50 is electrically connected to the connection pads 24.

A heat spreader 60 is mounted on the upper surface of the LSI chip 10 with adhesives 61. Sealing resin 62 is arranged at the junction between the LSI chip 10 and the inner lead 51 for protecting and sealing such junction.

In the embodiment, the LSI chip 10 has a square shape of 17.5 mm deep×17.5 mm wide, 812 input/output terminals being formed as pad on the periphery with spacing of 80 microns.

The film carrier 30 is formed from a polyimide film of 50 microns thick. The film carrier 30 is required to have heat resistance, good dimensional stability, and good adhesion with the conductive wiring 50. Thus, other materials used include fluorine type resin or epoxy type resin. In the film carrier 30, there are formed 812 through-holes 31 with diameter of 100 microns in a lattice with at intervals of 1.27 mm.

The conductive wiring 50 connects 812 inner leads 51 with 80 microns pitch and 812 through-holes 31 of the film carrier 30. The conductive wiring 50 is made of copper, and its outside is plated with gold. The conductive wiring 50 has a width of 40 microns and a thickness of 25 microns.

The insulator 40 is formed from an alumina ceramic substrate of 200 microns thick. The through-holes 41 are formed in a lattice at intervals of 1.27 mm. The through-hole 41 has a diameter of 500 microns. The through-hole 41 is not necessarily plated with conductor, but may be plated with conductor. Material used for the insulator 40 is preferable to have resin with thermal expansion coefficient close to that of the organic film by taking into consideration stress when heat is applied. More specifically, polyimide or polyimide ether may be applied.

Epoxy type adhesives guaranteed for insulation and anti-migration are used as the adhesive 42 for bonding the film carrier 30 and the insulator 40. Adhesives with good thermal conductivity is used as the adhesive 61 for bonding the LSI chip 10 and the heat spreader 60. For example, silver-epoxy type adhesives in which the epoxy contains silver can be used. The substrate 20 is a glass-epoxy type printed circuit board.

As mentioned above, the ground pattern 21 is provided on the top surface of the substrate 20 and the insulator 40 with even main surfaces is provided between the ground pattern 21 and the film carrier 30. This can make the conductive wiring 50 insusceptible to noise from wiring arranged on the substrate 20. In addition, it is possible to adjust the impedance of the conductive wiring 50. More particularly, the impedance of the conductive wiring 50 is matched to that of wiring on the substrate to eliminate unmatching between them.

Now, the mounting method of the first embodiment is described in detail by referring to the drawings.

First, the through-holes 31 provided through the film carrier 30 are aligned with the through-holes 41 provided through the insulator 40, so that the film carrier 30 are bonded to the insulator 40 with the adhesives 42.

Referring to FIG. 3 (a), in the first step, solder paste 26 is applied on the connection pad 24 through screen printing.

Then, as shown in FIG. 3 (b), in the second step, a solder ball 27 is further formed on the solder paste 26. The solder paste 26 is joined to the solder ball 27 through heat treatment at a temperature between about 200 and 250° C. for about 20 minutes.

Referring to FIG. 3 (c), in the third step, the through-hole 31 is aligned with the solder ball 27.

Then, as shown in FIG. 3 (d), pressure is applied to the film carrier 30 toward the substrate 20, and heat is applied to melt the solder ball 27. Heat is applied at a temperature between about 200 and 250° C. for about 20 minutes. The solder is melted by heat and creeps up within the through-hole 31. The crept-up solder appears on the surface of the film carrier 30. Since connection of the solder can be visually observed above the film carrier 30, it can be easily determined whether or not the film carrier 30 connects the substrate 20.

Next is described a second embodiment of the present invention. The second embodiment has the wiring arrangement of the conductive wiring different from that of the first embodiment.

Referring to FIG. 4, the mounting structure for integrated circuit device according to the present invention comprises a film carrier 32, conductive wiring 52 provided on the film carrier 32, and an insulator 43 bonded to the film carrier 32.

The conductive wiring 52 contains an outer lead 53 which is connected to a connection pad 24 provided on the substrate 20. The film carrier 32 is bonded to the insulator 43 with adhesives 42. The area to which the film carrier 32 and the insulator 43 face is smaller than that of the first embodiment.

As described above, the embodiment requires the insulator 43 to have a smaller area than that of the first embodiment.

While the ground pattern 21 in above embodiment is arranged in a region surrounded by the connection pad 24, it may be arranged only in a region on the substrate 20 opposite to the conductive wiring 50. In addition, while the above embodiment is arranged to have the insulators 40 and 43 with even main surfaces between the ground pattern 21 and the film carrier 30, it may be arranged that the film carrier 30 itself is used in place of the insulator 40 by forming it to have even main surfaces, thereby providing substantially equal spacing between the ground pattern 21 and the conductive wiring 50.

As is clear from the foregoing description, the present invention has an advantage that the structure is made insusceptible to noise from the wiring arranged on the substrate due to provide the ground pattern on the surface of the substrate and the insulator between the ground pattern and the film carrier. In addition, the present invention also has yet another advantage that the characteristic impedance of wiring on the substrate can be matched with the impedance from the outer lead to the inner lead.

It may be possible to form the ground pattern 21 in the substrate 20. A layer between the ground pattern 21 and a surface of the substrate function as an insulator.

While this invention has been described in conjunction with the preferred embodiments thereof, it will now readily be possible for those skilled in the art to put this invention into practice in various other manners.

What is claimed is:

1. A mounting structure for an integrated circuit device comprising:

a first substrate on which said integrated circuit is provided;

a second substrate;

conductive wiring provided on said first substrate and electrically connected to said integrated circuit device;

a ground pattern provided on an area of said second substrate corresponding to said conductive wiring; and an insulator provided between said conductive wiring and said ground pattern.

2. The mounting structure for an integrated circuit device as claimed in claim 1, wherein said insulator comprises first and second main surfaces, each of said first and second main surfaces are substantially flat.

3. The mounting structure for an integrated circuit device as claimed in claim 1, wherein the thickness of said insulator is selectively adjusted.

4. The mounting structure for an integrated circuit device as claimed in claim 1, wherein said second substrate comprises a plurality of connection pads which are electrically connected to said conducive wiring, said ground pattern being provided in a region surrounded by said plurality of connection pads.

5. The mounting structure for an integrated circuit device as claimed in claim 1, wherein said second substrate comprises an inner ground layer electrically connected to said ground pattern.

6. The mounting structure for an integrated circuit device as claimed in claim 5, wherein said second substrate comprises through-holes for connecting said inner ground layer and said ground pattern.

7. The mounting structure for an integrated circuit device as claimed in claim 1, wherein said first substrate comprises a plurality of first through-holes electrically connected to said conductive wiring;

said insulator comprising a plurality of second through-holes provided at positions corresponding to said first through-holes;

said substrate comprising a plurality of connection pads provided at positions corresponding to said first through-holes;

said ground pattern being surrounded by said plurality of connection pads and provided at a position corresponding to said conductive wiring on said first substrate.

8. The mounting structure for an integrated circuit device as claimed in claim 1, wherein said area is overlaid with said ground pattern.

9. A mounting structure for an integrated circuit device comprising:

conductive wiring provided on a first substrate and electrically connected to said integrated circuit device mounted on said first substrate;

a ground pattern formed in at least an area of a second substrate corresponding to said conductive wiring;

an insulator provided between said conductive wiring and said ground pattern.

10. The mounting structure for an integrated circuit device as claimed in claim 9, wherein said ground pattern is formed only in an area of said substrate opposing to said conductive wiring.

* * * * *